(12) United States Patent
Bieletzki-Welz et al.

(10) Patent No.: US 9,214,779 B2
(45) Date of Patent: Dec. 15, 2015

(54) RETAINING AND CONTACTING ELEMENT, CONTACTING ARRANGEMENT AND METHOD FOR ESTABLISHING A CONTACTING ARRANGEMENT

(71) Applicant: Johnson Controls GmbH, Burscheid (DE)

(72) Inventors: Viktor Bieletzki-Welz, Leichlingen (DE); Lachezar Nikolov, Sofia (BG)

(*) Notice: Subject to any disclaimer, the term of this patent is extended or adjusted under 35 U.S.C. 154(b) by 382 days.

(21) Appl. No.: 13/890,983

(22) Filed: May 9, 2013

(65) Prior Publication Data
US 2013/0301232 A1 Nov. 14, 2013

(30) Foreign Application Priority Data

May 10, 2012 (DE) .................. 10 2012 009 358
Jul. 20, 2012 (EP) .................... 12 177 355

(51) Int. Cl.
| | | |
|---|---|---|
| H01B 7/08 | (2006.01) | |
| H01R 43/16 | (2006.01) | |
| H01R 12/72 | (2011.01) | |
| H01R 12/52 | (2011.01) | |
| H05K 3/36 | (2006.01) | |
| H01R 12/73 | (2011.01) | |

(52) U.S. Cl.
CPC .............. *H01R 43/16* (2013.01); *H01B 7/0846* (2013.01); *H01R 12/52* (2013.01); *H01R 12/725* (2013.01); *H01R 12/73* (2013.01); *H05K 3/368* (2013.01); *H05K 2201/042* (2013.01); *Y10T 29/4921* (2015.01); *Y10T 29/49208* (2015.01)

(58) Field of Classification Search
CPC .... H01R 12/78; H01R 12/724; H01R 12/725; H01R 12/727; H05K 3/368; H05K 2201/042; H01B 7/0846

USPC .......... 361/789, 803, 804; 174/72 TR, 117 F, 174/117 FF
See application file for complete search history.

(56) References Cited

U.S. PATENT DOCUMENTS

| | | | |
|---|---|---|---|
| 4,602,316 A | 7/1986 | Feick | |
| 4,845,315 A * | 7/1989 | Stopper | 361/827 |
| 5,345,205 A * | 9/1994 | Kornrumpf | 333/246 |
| 6,225,688 B1 * | 5/2001 | Kim et al. | 257/686 |
| 7,167,373 B1 * | 1/2007 | Hoang et al. | 361/749 |
| 2007/0259538 A1 | 11/2007 | Brodsky et al. | |
| 2010/0151705 A1 | 6/2010 | Su et al. | |
| 2011/0249419 A1 | 10/2011 | Sun | |
| 2012/0230000 A1 * | 9/2012 | Ishino et al. | 361/803 |

OTHER PUBLICATIONS

European Search Report for application No. Ep 12 17 7355 mailed Nov. 19, 2012.

* cited by examiner

*Primary Examiner* — Ramon Barrera
(74) *Attorney, Agent, or Firm* — Fletcher Yoder, P.C.

(57) ABSTRACT

The invention relates to a retaining and contacting element (1) having a substantially U-shaped cross section comprising:
 a web (5),
  a first flange (3) and a second flange (4), wherein the flanges (3, 4) extend from an upper side of the web (5),
  a second molding (7) extending from the second flange (4) in parallel to the web (5),
  a plurality of conductive paths (12) arranged at least on part of an upper side (11) of the second molding (7), wherein a longitudinal extension of the conductive paths (12) runs in parallel with a longitudinal extension of the web (5).

Moreover, the invention relates to a contacting arrangement (2) and to a method for establishing a contacting arrangement (2).

19 Claims, 2 Drawing Sheets

RETAINING AND CONTACTING ELEMENT, CONTACTING ARRANGEMENT AND METHOD FOR ESTABLISHING A CONTACTING ARRANGEMENT

CROSS REFERENCE TO RELATED APPLICATIONS

This application claims priority from and the benefit of German Patent No. DE 10 2012 009 358.6, filed on May 10, 2012; and European Patent EP 12 177 355.0, filed on Jul. 20, 2012; both entitled "Retaining and Contacting Element, Contacting Arrangement and Method for Establishing a Contacting Arrangement", which are herein incorporated by reference.

BACKGROUND

The invention relates to a retaining and contacting element, a contacting arrangement and a method for establishing a contacting arrangement.

Conventionally, electronic printed circuit boards are multi-level stacked in housings, i.e. a plurality of printed circuit boards are stacked spaced from each other by means of separate retaining elements and contacted by means of respective electrical connection wires.

SUMMARY

It is an object of the present invention to provide an improved retaining and contacting element, an improved contacting arrangement and an improved method for establishing a contacting arrangement.

The object is achieved by a retaining and contacting element according to claim 1, a contacting arrangement according to claim 13 and a method for contacting according to claim 15.

According to the invention a retaining and contacting element has a substantially U-shaped cross section comprising:
 a web,
 a first flange and a second flange, wherein the flanges extend from an upper side of the web,
 a second moulding extending from the second flange in parallel to the web,
 a plurality of conductive paths arranged at least on part of an upper side of the second moulding, wherein a longitudinal extension of the conductive paths runs in parallel with a longitudinal extension of the web. The longitudinal extension of the web in the context of this specification is the extension from the first flange to the second flange.

In an exemplary embodiment at least one live hinge is arranged in the second moulding dividing the second moulding into at least two sections. Live hinges are hinges which are arranged as a single part with the two elements to be connected. Live hinges substantially consist of a wall connection with a reduced thickness, e.g. in the shape of a flexible reduction allowing a limited rotary motion of the connected parts.

Preferably at least two live hinges are arranged in the second moulding dividing the second moulding into at least three sections.

Preferably, the live hinge or live hinges substantially runs/run in parallel with the second flange.

The live hinge may be arranged at a lower side of the second moulding opposite the upper side, preferably as a wedge shaped notch cut into the lower side of the second moulding. In alternative embodiments the live hinge may be arranged as portions of reduced thickness by cutting a wedge shaped notch into the upper side of the second moulding or by cutting a respective wedge shaped notch into either side of the second moulding.

In an exemplary embodiment the plurality of conductive paths extend over three neighbouring sections of the upper moulding divided by two live hinges, one of the sections adjacent the second flange, wherein the first section faces away from the web.

In an alternative embodiment the plurality of conductive paths extend from the second moulding over an outer face of the second flange to the web at least partially covering the web, wherein the second flange may face towards the web. This allows for retaining and contacting element with one live hinge or even without a live hinge.

In an exemplary embodiment the retaining and contacting element comprises a first moulding extending from the first flange in parallel to the web. This improves the robustness of the retaining and contacting element as the first flange may be used to support an electric component to be contacted.

In an exemplary embodiment the retaining and contacting element comprises or is made of plastics or a plastic compound, wherein the conductive paths are part of a conductive layer on the retaining and contacting element.

In an exemplary embodiment the first flange and/or the second flange are arranged at an angle between 90 degrees and 170 degrees with respect to the web. Smaller angles towards 90 degrees allow for higher precision in the distances between the electric components to be contacted by the retaining and contacting element. Angles, considerably greater than 90 degrees allow for tolerances in these distances and may improve the contacting reliability.

In an exemplary embodiment of the second live hinge is arranged in a distance from and in parallel to the first live hinge, wherein the distance substantially equals a height of the flanges.

According to the invention, in a contacting arrangement between at least two electrical components or electrical assemblies to be contacted at least one retaining and contacting element is arranged. The retaining and contacting element is at least partially or in sections coated with an electrically conductive layer.

A method for establishing a contacting arrangement comprises:
 providing a first electric component, a second electric component and a retaining and a contacting element,
 attaching the web of the retaining and contacting element positively, non-positively and/or by adhesive bond to the first electric component,
 moving the first live hinge in such a manner that the first section of the second moulding adjacent the second flange remains in parallel to the web while a neighbouring second section is arranged substantially at a 90 degree angle with respect to the first section,
 moving the second live hinge in such a manner that the third section of the second moulding is arranged substantially at a 90 degree angle with respect to the second section towards the web thereby electrically contacting the conductive paths in the third section to the first electric component,
 aligning the second electric component substantially in parallel with the first electric component and positively, non-positively and/or by adhesive bond attaching it on the upper side of the first section of the second moulding thereby electrically contacting the conductive path in the first section to the second electric component.

Hence, by means of the retaining and contacting element with the conductive paths of the electrically conductive layer arranged in sections on the retaining and contacting element an electrically operative connection between the first electric component and the second electric component is achieved.

The resulting contacting arrangement according to the invention comprises:
a first electric component, a second electric component and a retaining and contacting element, wherein:
the web of the retaining and contacting element is positively, non-positively and/or by adhesive bond attached to the first electric component,
the first live hinge is rotated in such a manner that the first section of the second moulding adjacent the second flange remains in parallel to the web while a neighbouring second section is arranged at a 90 degree angle with respect to the first section,
the second live hinge is rotated in such a manner that the third section of the second moulding is arranged at a 90 degree angle with respect to the second section towards the web so that the conductive paths in the third section electrically contact the first electric component,
the second electric component is aligned substantially in parallel with the first electric component and positively, non-positively and/or by adhesive bond attached to the upper side of the first section of the second moulding so that the conductive path in the first section electrically contacts the second electric component.

Preferably, the electric components are arranged as electrical printed circuit boards.

Thus, a conventional retaining element and a conventional contacting element are substituted by a combined retaining and contacting element so that a part count decreases.

For example, a conventional, expensive plug connector system for contacting neighbouring printed circuit boards may be replaced by a combined retaining and contacting element.

DRAWINGS

The present invention will become more fully understood from the detailed description given hereinbelow and the accompanying drawings which are given by way of illustration only, and thus, are not limitive of the present invention, and wherein:

FIG. 1 is a schematic lateral view of a retaining and contacting element for establishing a contacting arrangement according to the invention, FIG. 2 is a schematic perspective view of a retaining and contacting element, FIG. 3 is a schematic detail view of a second moulding of a retaining and contacting element, FIG. 4 is a schematic lateral view of a contacting arrangement according to the invention, and FIG. 5 is a schematic perspective view of a retaining and contacting element arranged on a first electric component.

DETAILED DESCRIPTION

Corresponding parts are marked with the same reference symbols in all figures.

Figure 1:
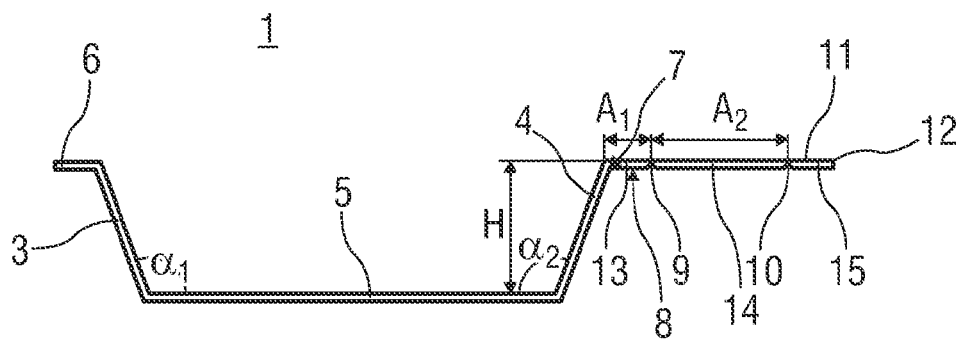
FIG. 1 is a schematic lateral view of a retaining and contacting element 1 for establishing a contacting arrangement 2 according to the invention which is illustrated in FIG. 4.
Figure 2:
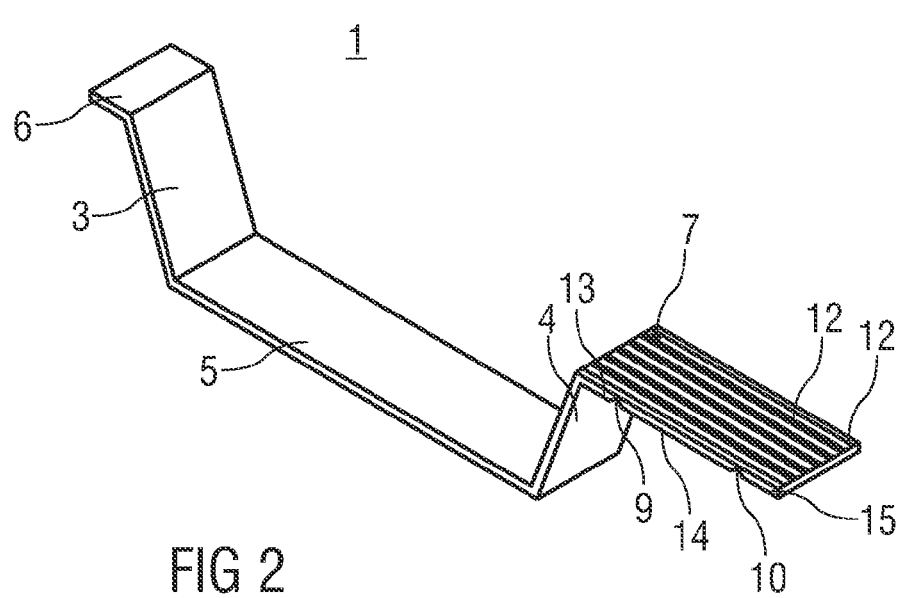
FIG. 2 is a schematic perspective view of the retaining and contacting element 1.

The retaining and contacting element 1 exhibits a substantially U-shaped cross section with a first flange 3, a second flange 4 and a web 5, wherein the flanges 3, 4 extend from an upper side of the web 5.

The retaining and contacting element preferably comprises or is made of plastics or a plastic compound.

The web 5 substantially forms a flat base plane.

The first flange 3 is arranged at a pre-determined angle $\alpha_1$ with respect to the web 5 in a conventional manner. Preferably the value of the angle $\alpha_1$ is between 90 degrees and 170 degrees. The first flange 3 is extended by a first moulding 6 arranged in parallel to the web 5 of the U-shaped cross section.

In the illustrated embodiment the first moulding 6 is arranged at an angle with respect to the first flange 3 facing away from the web 5.

In an alternative non-illustrated embodiment the first moulding 6 may be arranged at an angle with respect to the first flange 3 facing towards the web 5.

The second flange 4 is arranged at a pre-determined angle $\alpha_2$ with respect to the web 5 in a conventional manner. Preferably the value of the angle $\alpha_2$ is between 90 degrees and 170 degrees. The second flange 4 is extended by a second moulding 7 arranged in parallel to the web 5 of the U-shaped cross section.

At a lower side 8 of the second moulding 7 at least two live hinges 9, 10 are arranged. Live hinges 9, 10 are conventional hinges which are arranged as a single part with the two elements to be connected. Live hinges 9, 10 substantially consist of a wall connection with a reduced thickness, e.g. in the shape of a flexible reduction allowing a limited rotary motion of the connected parts.

Figure 3:
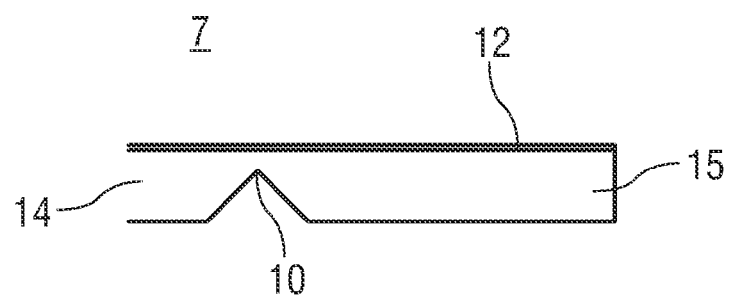

FIG. 3 is a schematic view of the second live hinge 10 as a detail view of the second moulding 7 of the retaining and contacting element 1.

On an upper side 11 of the second moulding 7 an electrically conductive layer is arranged. The electrically conductive layer is preferably arranged as a plurality of single, conductive paths 12 arranged in parallel to each other. A longitudinal extension of the conductive paths 12 runs in parallel with the longitudinal extension of the web 5 between the flanges 3, 4.

The first live hinge 9 runs in a pre-determined distance $A_1$ from the second flange 4 and is arranged in the second moulding 7 transversely with respect to the conductive paths 12 arranged in the upper side 11.

The second live hinge 10 is arranged in the second moulding 7 in a pre-determined distance $A_2$ from and in parallel to the first live hinge 9. The distance $A_2$ between the two live hinges 9 and 10 equals a height H of the flanges 3 and 4.

Thus, the second moulding 7 is divided into three sections 13, 14 and 15 by the two live hinges 9 and 10.

In the illustrated embodiment the live hinges 9 and 10 are arranged as portions of reduced thickness by cutting a wedge shaped notch into the lower side 8 of the second moulding 7. In alternative non-illustrated embodiments the live hinges 9 and 10 could be arranged as portions of reduced thickness by cutting a wedge shaped notch into the upper side 11 of the second moulding 7 or by cutting a respective wedge shaped notch into either side of the second moulding 7.

Figure 4:
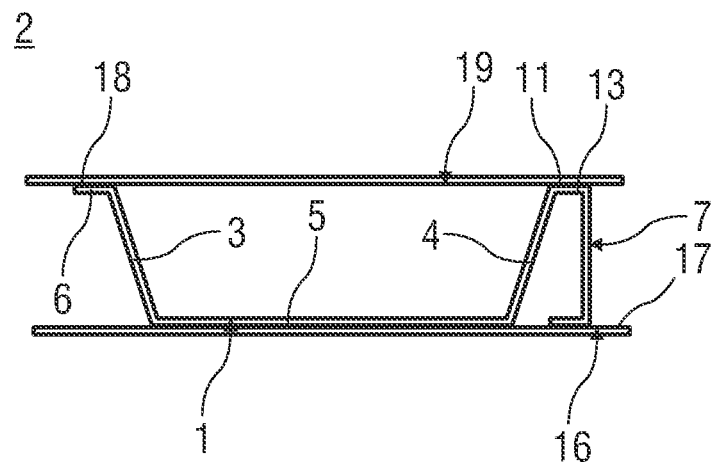

FIG. 4 is a schematic lateral view of the contacting arrangement 2 according to the invention.

Figure 5:
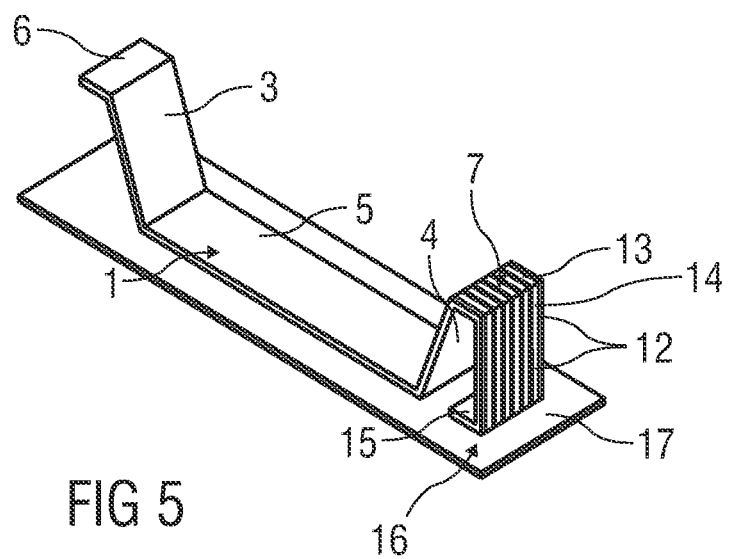

FIG. 5 is a schematic perspective view of a retaining and contacting element 1 arranged on a first electric component 16.

In a method for establishing the contacting arrangement 2, the web 5 of the retaining and contacting element 1 is positively, non-positively and/or by adhesive bond attached to a first electric component 16.

The first live hinge 9 is moved in such a manner that a first section 13 of the second moulding 7 remains in parallel to the web 5 and aligned within a plane with the first moulding 6 while a neighbouring second section 14 is arranged at a 90 degree angle with respect to this first section 13.

The second live hinge 10 is moved in such a manner that a third section 15 of the second moulding 7 is arranged at a 90 degree angle with respect to the second section 14 towards the web 5. Thus, the third section 15 is aligned in the same spatial plane as the web 5.

The conductive paths 12 of the electrically conductive layer on the sections 13, 14 and 15 are thus deformed so that the sections of the conductive paths 12 in the third section 15 of the second moulding 7 are located on a surface 17 of the first electric component 16 thus contacting the first electric component.

A second electric component 19 is aligned substantially in parallel with the first electric component 16 and positively, non-positively and/or by adhesive bond attached on the upper side 18 of the first moulding 6 and on the upper side 11 of the first section 13 of the second moulding 7. Thus, the sections of the conductive path 12 arranged on the first section 13 contact the second electric component 19.

Hence, by means of the retaining and contacting element 1 with the conductive paths 12 of the electrically conductive layer arranged in sections on the retaining and contacting element 1 an electrically operative connection between the first electric component 16 and the second electric component 19 is achieved.

Preferably, the electric components 16, 19 are arranged as electrical printed circuit boards.

Thus, a conventional retaining element and a conventional contacting element are substituted by a combined retaining and contacting element 1 so that a part count decreases.

In the illustrated embodiment the second moulding 7 is arranged at an angle with respect to the second flange 4 facing away from the web 5.

In an alternative non-illustrated embodiment the second moulding 7 could be arranged at an angle with respect to the second flange 4 facing towards the web 5. In this configuration the retaining and contacting element 1 could be arranged without or with only one live hinge 9, wherein the conductive paths 12 would extend over the first section 13, an outer face of the second flange 4 and at least a part of the web 5 adjacent the second flange 4.

The invention claimed is:

1. A retaining and contacting element having a substantially U-shaped cross section comprising:
   a web,
   a first flange and a second flange, wherein the flanges extend from an upper side of the web,
   a moulding extending from the second flange in parallel to the web,
   a plurality of conductive paths arranged at least on part of an upper side of the moulding, wherein a longitudinal extension of the conductive paths runs in parallel with a longitudinal extension of the web.

2. The retaining and contacting element according to claim 1, wherein at least one live hinge is arranged in the moulding dividing the moulding into at least two sections.

3. The retaining and contacting element according to claim 2, wherein at least two live hinges are arranged in the moulding dividing the moulding into at least three sections.

4. The retaining and contacting element according to claim 2, the live hinge substantially runs in parallel with the second flange.

5. The retaining and contacting element according to claim 2, wherein the live hinge is arranged at a lower side of the moulding opposite the upper side.

6. The retaining and contacting element according to claim 5, wherein the live hinge is arranged as a wedge shaped notch cut into the lower side of the moulding.

7. The retaining and contacting element according to claim 3, wherein the plurality of conductive paths extend over three neighbouring sections of the moulding, one of the neighboring sections being adjacent the second flange, and wherein the first section faces away from the web.

8. The retaining and contacting element according to claim 1, comprising a further moulding extends from the first flange in parallel to the web.

9. The retaining and contacting element according to claim 1, wherein the retaining and contacting element comprises or is made of plastics or a plastic compound, and wherein the conductive paths are part of a conductive layer on the retaining and contacting element.

10. The retaining and contacting element according to claim 1, wherein the first flange and/or the second flange is arranged at an angle between 90 degrees and 170 degrees with respect to the web.

11. The retaining and contacting element according to 3, comprising a second live hinge arranged in a distance from and in parallel to a first live hinge, wherein the distance substantially equals a height of the flanges.

12. A contacting arrangement, comprising:
   a first electric component, a second electric component and a retaining and contacting element according to claim 3, wherein:
   the web of the retaining and contacting element is attached to the first electric component,
   a first live hinge is rotated in such a manner that a first section of the moulding adjacent the second flange remains parallel to the web while a neighbouring second section is arranged at a 90 degree angle with respect to the first section,
   a second live hinge is rotated in such a manner that a third section of the moulding is arranged at a 90 degree angle with respect to the second section towards the web so that the conductive paths in the third section electrically contacts the first electric component,
   the second electric component is aligned substantially in parallel with the first electric component and attached to an upper side of the first section of the moulding so that a conductive path in the first section electrically contacts the second electric component.

13. The contacting arrangement according to claim 12, wherein at least one of the first electric component and the second electric component is arranged as a printed circuit board.

14. A method for establishing a contacting arrangement, comprising:
   providing a first electric component, a second electric component and a retaining and a contacting element according to claim 3,
   attaching the web of the retaining and contacting element to the first electric component,
   moving a first live hinge in such a manner that a first section of the moulding adjacent the second flange remains parallel to the web while a neighbouring second section is arranged at a 90 degree angle with respect to the first section, moving a second live hinge in such a manner that a third section of the moulding is arranged at a 90 degree angle with respect to the second section towards the web thereby electrically contacting conductive paths in the third section to the first electric component, aligning the second electric component substantially parallel with the first electric component and attaching the second electric component on an upper side (11) of the first section of the moulding thereby electrically contacting a conductive path in the first section to the second electric component.

15. The contacting arrangement of claim 12, wherein the web of the retaining and contacting element is positively attached to the first electric component.

16. The contacting arrangement of claim 12, wherein the web of the retaining and contacting element is non-positively and/or by adhesive bond attached to the first electric component.

17. The contacting arrangement of claim 12, wherein the second electric component is positively attached on an upper side of the first section of the moulding.

18. The contacting arrangement of claim 12, wherein the second electric component is non-positively and/or by adhesive bond attached on an upper side of the first section of the moulding.

19. The method of claim 14, wherein the web of the retaining and contacting element is non-positively and/or by adhesive bond attached to the first electric component.

* * * * *